US010697277B2

(12) United States Patent
Liao et al.

(10) Patent No.: US 10,697,277 B2
(45) Date of Patent: Jun. 30, 2020

(54) SIMULATION DEVICE AND METHOD FOR INTEGRATED EVALUATION EXPERIMENT FOR SAND CONTROL WELLBORE PLUGGING AND PLUGGING REMOVAL

(71) Applicant: CHINA UNIVERSITY OF PETROLEUM (EAST CHINA), Qingdao, Shandong (CN)

(72) Inventors: Hualin Liao, Shandong (CN); Lin Dong, Shandong (CN); Jilei Niu, Shandong (CN); Changyin Dong, Shandong (CN); Wenhao Ma, Shandong (CN); Shuai Yang, Shandong (CN); Yue Xu, Shandong (CN); Yandong Yang, Shandong (CN); Hongliang Wang, Shandong (CN)

(73) Assignee: CHINA UNIVERSITY OF PETROLEUM (EAST CHINA), Qingdao (CN)

( * ) Notice: Subject to any disclaimer, the term of this patent is extended or adjusted under 35 U.S.C. 154(b) by 0 days.

(21) Appl. No.: 16/578,269

(22) Filed: Sep. 20, 2019

(65) Prior Publication Data
US 2020/0019660 A1 Jan. 16, 2020

Related U.S. Application Data

(63) Continuation of application No. PCT/CN2017/114975, filed on Dec. 7, 2017.

(51) Int. Cl.
*E21B 43/12* (2006.01)
*E21B 33/13* (2006.01)
*E21B 47/06* (2012.01)

(52) U.S. Cl.
CPC ............ *E21B 43/12* (2013.01); *E21B 33/13* (2013.01); *E21B 47/06* (2013.01)

(58) Field of Classification Search
None
See application file for complete search history.

(56) References Cited

U.S. PATENT DOCUMENTS 5,042,297 A 8/1991 Lessi

FOREIGN PATENT DOCUMENTS

CN 101270640 A 9/2008
CN 101270641 A 9/2008
(Continued)

OTHER PUBLICATIONS

Changyin, D. et al., "Experimental and Visual Simulation of Gravel Packing in Horizontal and Highly Deviated Wells," SPE-169237-MS, (2014) (Year: 2014).*
(Continued)

*Primary Examiner* — Rehana Perveen
*Assistant Examiner* — Steven W Crabb
(74) *Attorney, Agent, or Firm* — Wayne & Ken, LLC; Tony Horn

(57) ABSTRACT

A simulation device for integrated evaluation experiment for sand control wellbore plugging and plugging removal, including a wellbore system, a whole sand control well plugging system, a local sand control well plugging system and a plugging removal system. The wellbore system simulates downhole working conditions of the sand control wellbore. Perforations of the whole sand control well plugging system and sand-filled pipe of the local sand control well plugging system are applied on the casing pipe of the wellbore system. The plugging process of the sand control well system is simulated by pumping a sand-laden slurry into the wellbore system. The plugging removal process is simulated by setting the plugging removal tool of plugging removal system through an oil tube in the wellbore system. The plugging removal effect of the plugging removal tool is
(Continued)

analyzed and evaluated according to the reliable data measured by the pressure gauge, flowmeter, etc.

7 Claims, 3 Drawing Sheets

(56) References Cited

FOREIGN PATENT DOCUMENTS

| CN | 102353550 A | 2/2012 |
| CN | 104265248 A | 1/2015 |
| CN | 104265273 A | 1/2015 |
| CN | 104316436 A | 1/2015 |
| CN | 104420869 A | 3/2015 |
| CN | 105735956 A | 7/2016 |
| CN | 205719486 U | 11/2016 |
| CN | 107044273 A | 8/2017 |

OTHER PUBLICATIONS

Suman, George O., Jr. et al., "Sand Control Design Criteria and Gravel Packing Concepts," SPE 10031 pp. 123-132 (1982) (Year: 1982).*

* cited by examiner

SIMULATION DEVICE AND METHOD FOR INTEGRATED EVALUATION EXPERIMENT FOR SAND CONTROL WELLBORE PLUGGING AND PLUGGING REMOVAL

CROSS-REFERENCE TO RELATED APPLICATIONS

This application is a continuation of International Application No. PCT/CN2017/114915 with a filing date of Dec. 7, 2017, designating the United States, now pending, and further claims to the benefit of priority from Chinese Application No. 201710222792.0 with a filing date of Apr. 7, 2017. The content of the aforementioned applications, including any intervening amendments thereto, are incorporated herein by reference.

TECHNICAL FIELD

The present application relates to oil-gas development field, and more particularly to a simulation device and method for integrated evaluation experiment for sand control wellbore plugging and plugging removal.

BACKGROUND OF THE INVENTION

Currently, sand production is one of the main problems occurring in the exploitation of unconsolidated sandstone reservoirs. Through the studies on reducing the impact of sand production on oil and gas development, the simulation test devices for gravel packing holes are developed, which can simulate the bottom-hole flowing state and the wellbore plugging process under different sand control well completion methods. Besides, other formulas, devices and techniques for plugging removal also provide some solutions for particular plugging under certain conditions.

However, it needs to be pointed that currently, there is no particular device for comparing and analyzing the plugging removal effect of different types of tools and techniques. It is impossible to determine the plugging removal effect and applicability of various plugging removal tools under different plugging situations, and there is no experimental device that combines the plugging with plugging removal process in sand control well.

SUMMARY OF THE INVENTION

Based on the technical problems above, an object of the present invention is to provide a simulation device and method for integrated evaluation experiment for sand control wellbore plugging and plugging removal, comprising:

A simulation device for integrated evaluation experiment for sand control wellbore plugging and plugging removal, comprising:
  a wellbore system,
  a whole sand control well plugging system,
  a local sand control well plugging system, and
  a plugging removal system;
  wherein the wellbore system comprises a casing pipe and a sand screen pipe which are fixed on a support frame; the sand screen pipe located in the casing pipe and the casing pipe are coaxially arranged; a gravel packing section is formed between the casing pipe and the sand screen pipe; and a top cover at a top of the sand screen pipe is connected to the casing pipe by bolts, so that the top cover and the sand screen pipe are sealed to form a cavity;

the whole sand control well plugging system comprises a plurality of perforations and a second water inlet pipe; the perforations spaced are distributed on the casing pipe along a length direction, and each perforation is provided with a second pressure sensor and connected to a second water tank via the second water inlet pipe which is provided with a second flowmeter, a second valve, a pressure stabilizer, a second pressure gauge and a second pump;

the local sand control well plugging system comprises a sand-filled casing pipe with a plurality of third pressure sensors along an axial direction of the sand-filled pipe, and a third water inlet pipe; one end of the sand-filled pipe is fixed on the casing pipe and connected to the gravel packing section, and the other end of the sand-filled pipe is connected to the second water tank via the third water inlet pipe which is provided with a third pump, a third pressure gauge, a third valve and a third flowmeter;

the plugging removal system comprises an oil tube, a first water inlet pipe and a water outlet pipe; a plugging removal tool, a centralizer, a filter and an assembly ring are successively provided from bottom to top at the oil tube which is located in and coaxially provided with the sand screen pipe; the oil tube communicates with a first water tank via the first water inlet pipe which is provided with a first pump, a first valve, a first flowmeter and a first pressure gauge; one end of the water outlet pipe communicates with the cavity, and the other end of the water outlet pipe communicates with a third water tank; and the first water inlet pipe is provided with a first pressure sensor and a confining pressure regulating valve.

In some embodiments, a screen mesh is provided in the third water tank.

In some embodiments, the casing pipe and sand screen pipe are made of transparent organic glass.

Another object of the prevention is to provide a simulation method for integrated evaluation experiment for the sand control wellbore plugging and plugging removal using the device above, comprising:

a) after experimental devices are connected, adding clean water as an operating fluid into the second water tank to simulate fluid production without sand, and recording flow rate and pressure according to pressure gauges, pressure sensors and flow meters;

b) adding a certain amount of sand into the clean water as an operating fluid to simulate a plugging process of the sand control wellbore; when simulating a plugging process of the whole sand control wellbore, opening the second pump to allow the operating fluid in the second water tank to flow into the wellbore system via the second water inlet pipe; when simulating a plugging process of a local sand control wellbore, opening the third pump to allow the operating fluid in the second water tank flow into the wellbore system via the third water inlet pipe;

c) opening the first pump to allow a blockage relieving acid flow into the wellbore system via the first water inlet pipe for the plugging removal; for local plugging, lifting up the plugging removal tool to the same height as the sand-filled pipe by the assembly ring; for whole plugging, lifting up and down the oil tube at a certain speed through the assembly ring while the plugging removal tool is working;

d) recording pressure at different locations and times and flow rates at different locations; and calculating, by the following formula, permeabilities of the local sand control wellbore and the whole sand control wellbore according to the recorded pressure and flow rate:

$$K_i = \frac{Q\mu\Delta L_i}{A\Delta P_i};$$

e) by comparing permeabilities before plugging, after plugging and after plugging removal and observing the simulation process, evaluating a plugging removal effect of the plugging removal tool; analyzing and evaluating the plugging removal effect with different working parameters when changing a speed for lifting the oil tube up and down, a pressure and displacement of the first pump during the plugging removal of the whole sand control wellbore; under the same simulation condition, applying different plugging removal tools or techniques to obtain a best plugging removal tool or technique under certain conditions according to the plugging removal effect.

In some embodiments, during the simulation, the confining pressure regulating valve is adjusted to hold pressure of the wellbore system to further simulate sand control intervals of different depths, and the pressure is obtained by the first pressure sensor.

In some embodiments, different plugging types of the sand control string are simulated by changing the size of the sand in the operating fluid in the second water tank and the size of gravels in the gravel packing section.

In some embodiments, during the plugging removal process, a dye is added to the blockage relieving acid, and the process is recorded by a high-speed camera for the later evaluation of the plugging removal effect.

The present invention has the following beneficial technical effects.

The present invention provides a device for simulation experiment for plugging and plugging removal processes of a sand control wellbore, which simulates whole and local plugging processes under two working conditions in the wellbore, sand control only with the sand screen pipe and that with gravel packing section filled in the sand screen pipe, to explore the plugging mechanism and mode of sand screen pipe and gravel packing section. The device can also be used to analyze and evaluate the plugging removal effect of various plugging removal tools under different stratum environments for preferably choosing the best plugging removal tool and technique suiting wellbores with different plugging characters. By selecting transparent organic glass as the material of the experimental device, the whole experimental process can be observed intuitively, the plugging process of sand control wellbores and the plugging removal effect of different plugging removal tools can be better understood. Combined with the relevant data measured in the experiment, the selection of plugging removal tools is more reasonable. In addition, by changing a speed for lifting the oil tube up and down, a pressure and displacement of the first pump and other factors, it can also be used to analyze and evaluate the influence of different plugging removal methods and working parameters on the plugging removal effect, leading to better guidance on the sand control well plugging removal work in the oil field.

BRIEF DESCRIPTION OF THE DRAWINGS

The present invention will be further described with reference to the accompanying drawings and embodiments.

Figure 1:
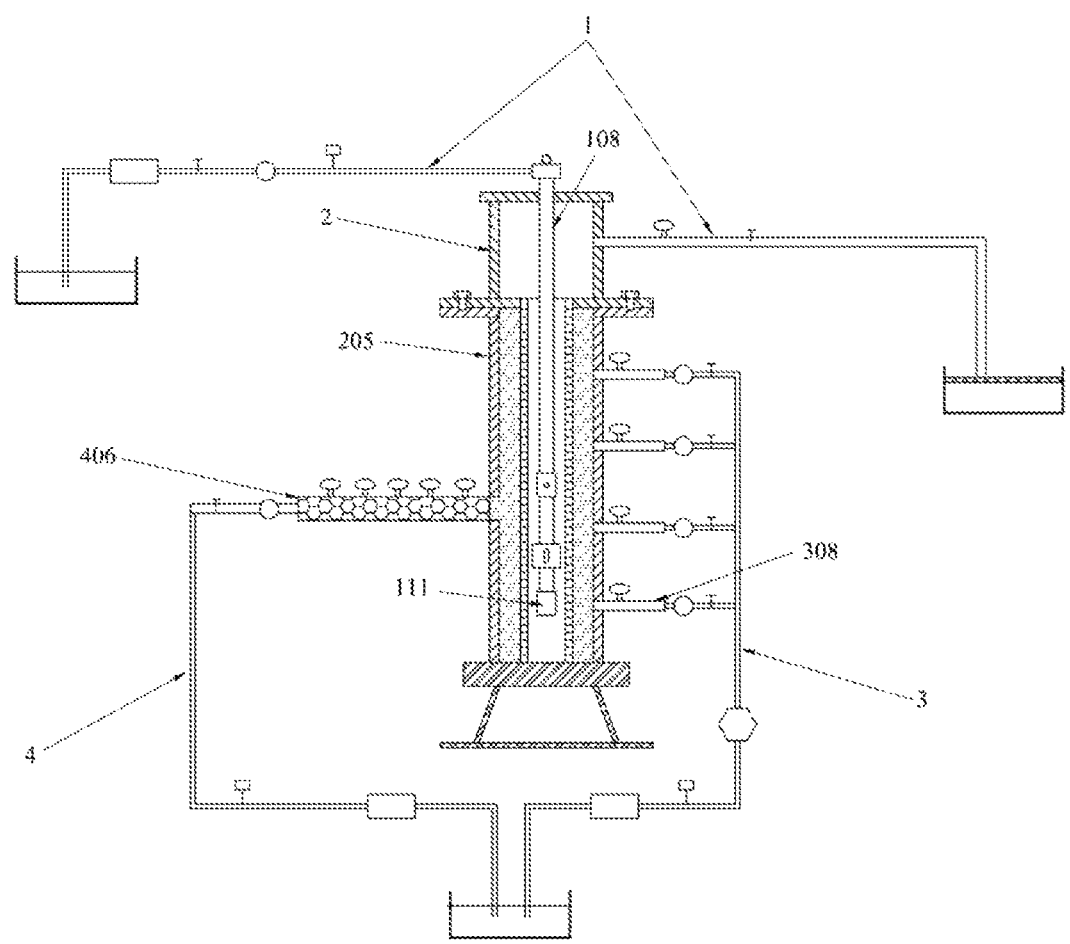
FIG. 1 is a schematic diagram of a simulation device for integrated evaluation experiment for sand control wellbore plugging and plugging removal.

In the drawings: 1, plugging removal system; 2, wellbore system; 3, whole sand control well plugging system; 4, local sand control well plugging system; 101, first water tank; 102, first pump; 103, first valve; 104, first flowmeter; 105, first pressure gauge; 106, first water inlet pipe; 107, assembly ring; 108, oil tube; 109, filter; 110, centralizer; 111, plugging removal tool; 112, first pressure sensor; 113, confining pressure regulating valve; 114, water outlet pipe; 115, screen mesh; 116, third water tank; 201, top cover; 202, bolt; 203, sand screen pipe; 204, gravel packing section; 205, casing pipe; 206, cavity; 207, support frame; 301, second water tank; 302, second pump; 303, second pressure gauge; 304, pressure stabilizer; 305, second water inlet pipe; 306, second valve; 307, second flowmeter; 308, perforation; 309, second pressure sensor; 401, third pump; 402, third pressure gauge; 403, third water inlet pipe; 404, third valve; 405, third flowmeter; 406, sand-filled pipe; 407, third pressure sensor.

DETAILED DESCRIPTION OF EMBODIMENTS

As shown in FIG. 1, illustrated is a simulation device for integrated evaluation experiment for sand control wellbore plugging and plugging removal, including: a plugging removal system 1; a wellbore system 2; a whole sand control well plugging system 3; a local sand control well plugging system 4. The wellbore system 2 simulates the downhole working conditions of the sand control wellbore. A plurality of perforations 308 of the whole sand control well plugging system 3 and a sand-filled pipe 406 of the local sand control well plugging system 4 are applied on the casing pipe 205 of the wellbore system 2. The plugging process of sand control wellbore system is simulated by pumping sand-laden slurry into the wellbore system 2. The plugging removal process is simulated by setting the plugging removal tool 111 of the plugging removal system 1 through bottom of the oil tube 108 into the wellbore system 2. The plugging removal effect of the plugging removal tool 111 is analyzed and evaluated according to the responsible data measured by pressure gauges, flowmeters, etc.

Figure 2:
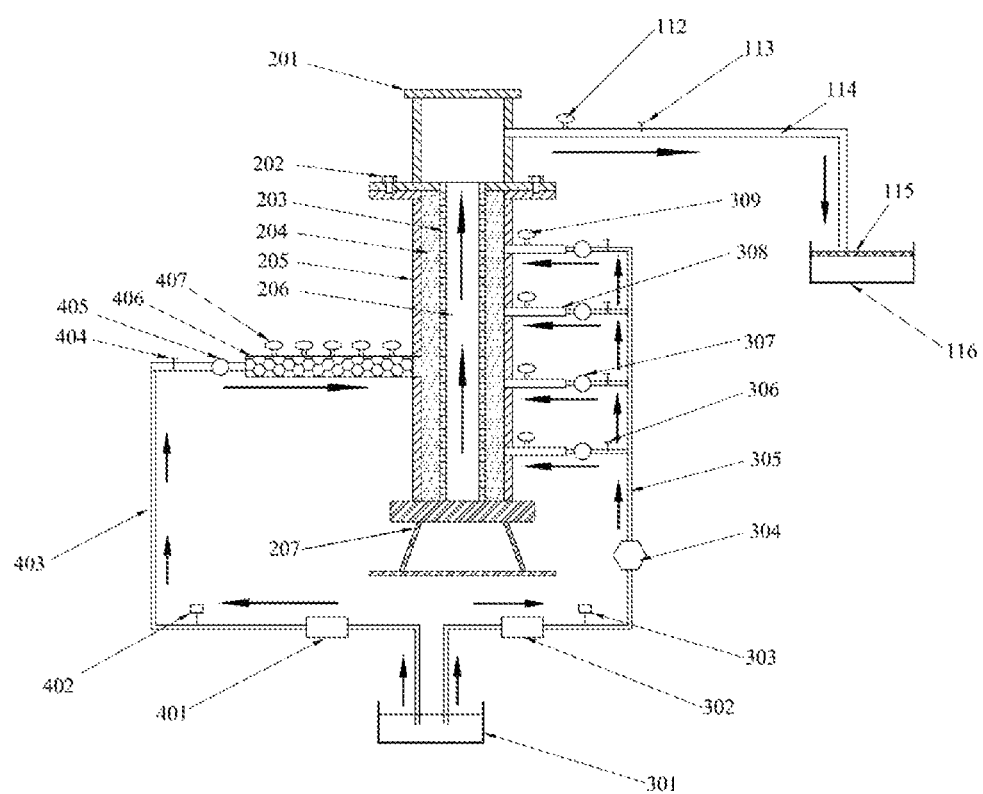
FIG. 2 is a schematic diagram showing a plugging simulation process, in which the casing pipe produces sands to plug the sand control well with a sand screen pipe filled in gravel.
Figure 3:
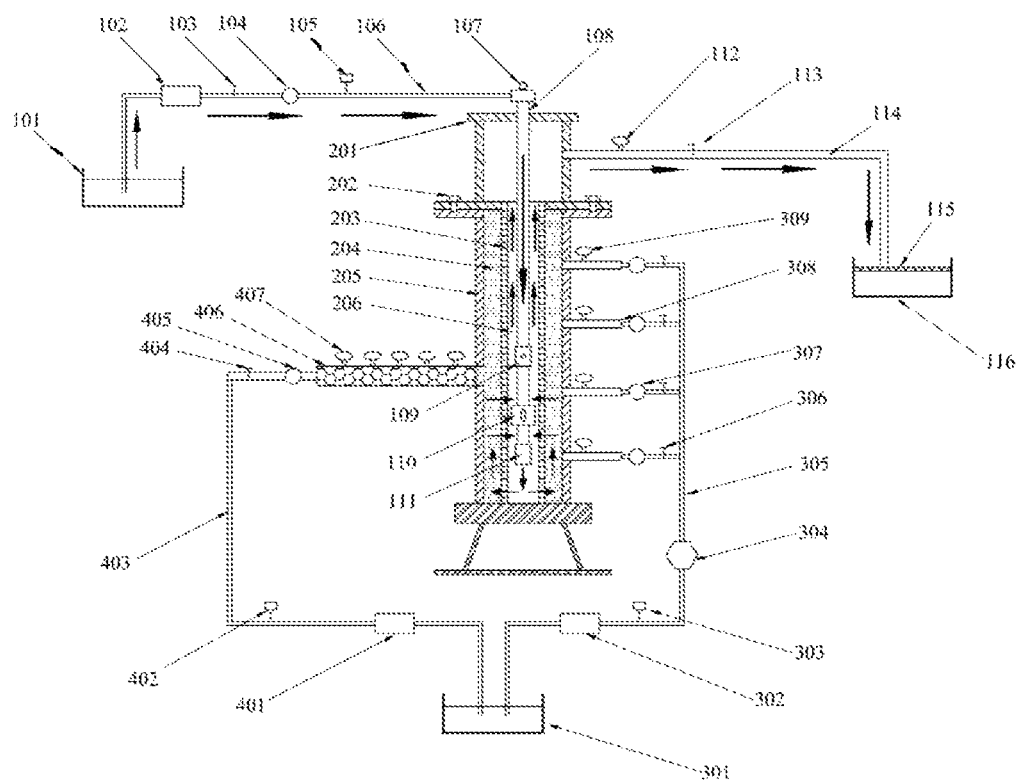
FIG. 3 is a schematic diagram showing a plugging removal simulation process of plugged sand control well with sand screen pipe filled in gravel.

As shown in FIGS. 2-3, the wellbore system 2 includes a support frame 207, a casing pipe 205, a sand screen pipe 203 and a top cover 201. The sand screen pipe 203 located in the casing pipe 205 and the casing pipe are coaxially arranged. The top cover 201 has a packer structure with a round hole at the top, which seals and keeps oil tube 108 steady together with the centralizer 110, and separates the interior of an upper end of the oil tube with the exterior of the oil tube. The top cover 201 is connected to the casing pipe 205 by bolts 202, so that the top cover and the sand screen pipe 203 are sealed to form a cavity 206. The top cover is connected with the water outlet to make sure that the fluid only exits from the water outlet. When simulating a plugging and plugging removal process of sand control wellbore with gravel packing section, the gravel packing section 204 is filled in the annulus between the casing pipe 205 and the sand screen pipe 203.

A plugging removal tool 111, a centralizer 110 and a filter 109 are successively provided from bottom to top at the oil tube 108 which is located in and coaxially provided with the sand screen pipe 203. An assembly ring 107 is located at the top of the oil tube 108 for adjusting the height of the plugging removal system 111 during plugging removal process.

A sand-filled pipe 406 and a plurality of perforations 308 are settled on the side wall of casing pipe 205. With a second pressure sensor 309 for measuring the pressure arranged on one end of each perforation 308, the other end connects with the second water inlet pipe 305, orderly provided with a second flow meter 307, a second valve 306, a pressure stabilizer pressure gauge 304, a second pressure gauge 303 and a second pump 302. The other end of the second water inlet pipe 305 is inserted into the fluid in the second water tank 301. The plugging process of whole sand control wellbore system is simulated by pumping sand-laden slurry into the wellbore system 2 using the second pump 302.

Multiple third pressure sensors 407 are installed along the axial direction of the sand-filled pipe 406 for measuring the pressure of different locations. With one end connecting with the sand-filled pipe 406 and the other end inserted into the second water tank 301 under the liquid surface as same as the second water inlet pipe 305, the third water inlet pipe 403 is also orderly provided with a third pump 401, a third pressure gauge 402, a third valve 404 and a third flowmeter 405. The sand-laden slurry is pumped from the second water tank 301 into the wellbore system 2 through the third water inlet pipe 403 and the sand-filled pipe 406 using the third pump 401 to achieve the simulation of plugging process of a local sand control wellbore.

The plugging removal system 1 further includes a first pump 102, a first valve 103, a first flowmeter 104, a first pressure gauge 105, etc., which are connected orderly on the first water inlet pipe 106 with two ends leading to the first water tank 101 and oil tube 108 respectively.

With one end connected with the side wall of the top cover 201, the water outlet pipe 114 is also connected with the first pressure sensor 112 for measuring pressure and a confining pressure regulating valve 113 for regulating pressure. The other end of the water outlet pipe 114 leads to the third water tank 116 where the screen mesh 115 is settled for filtering out sand particles from the liquid.

The simulating experiment flow of the plugging process for sand control wellbore is as follows.

As shown in FIG. 2, the casing pipe 205 and the sand screen pipe 203 are fixed on the support frame 207, and the casing pipe 205 and the sand screen pipe 203 located in the casing pipe are coaxially arranged, in other words, the sand screen pipe 203 is located in the center of the casing pipe 205. To simulate the plugging process under working condition of sand control wellbore only with the sand screen pipe, gravel packing section between the casing pipe 205 and the sand screen pipe 203 is not loaded; to simulate the plugging process under working condition of sand control wellbore with gravel packing section filled in the sand screen pipe, gravel packing section between the outer casing pipe 205 and inner sand screen pipe 203 is loaded. FIG. 2 shows a plugging process simulation under working condition of sand control wellbore with gravel packing section filled in the sand screen pipe.

The perforations 308 and the sand-filled pipe 406 are applied on the casing pipe 205. Other experimental devices are connected successively according to the relative positions of each experimental device as shown in FIG. 2.

After the experimental devices are connected, clean water is poured as an operating fluid into the second water tank 301 to simulate fluid production without sand, and the corresponding flow and pressure values are recorded according to the pressure gauges, pressure sensors and flowmeters.

Then, the sand is added into the clean water as an operating fluid to simulate a plugging process of the sand control wellbore. This device is able to simulate plugging processes of both whole- and local sand control wellbore. When simulating a plugging process of the whole sand control wellbore, the second pump 302 is opened to allow the operating fluid in the second water tank 301 to flow into the wellbore system 2 via the second water inlet pipe 305. When simulating a plugging process of a local sand control wellbore, the third working pump 401 is opened to allow the operating fluid in the second water tank 301 flow into the wellbore system 2 via the third water inlet pipe 403.

During the experimental process, the confining pressure regulating valve 113 is adjusted to hold pressure of the wellbore system to further simulate sand control intervals in different depths, and the pressure is obtained by the first pressure sensor 112.

Different plugging types of the sand control string are simulated by changing the size of the sand in the operating fluid in the second water tank and the size of the gravel in the gravel packing section.

The experimental flow of sand control wellbore plugging removal is as follows.

As shown in FIG. 3, while one end of the oil tube 108 is provided with a filter 109, a centralizer 110 and a plugging removal tool 111 successively, and the other one is connected with the first water inlet pipe 106 provided with the first pump 102 and the first flowmeter 104, etc. The connected oil tube 108 placed in the simulation wellbore, and the simulation wellbore are coaxially arranged.

The first pump 102 is opened to allow the blockage relieving acid to flow into the wellbore system via the first water inlet pipe 106 for plugging removal. For local plugging, the plugging removal tool 111 is lifted up to the same height as the sand-filled pipe 406 by the assembly ring 107. For whole plugging, the oil tube 108 is lifted up and down at a certain speed through the assembly ring 107 while the plugging removal tool 111 is working.

During the plugging removal process, a dye is added to the blockage relieving acid, and the process is recorded by a high-speed camera for the later evaluation of the plugging removal effect.

During the experiment, the pressure at different locations and times and the flow rates at different locations are recorded, permeabilities of the local sand control wellbore and the whole sand control wellbore are calculated according to the recorded pressure and flow rate.

The permeability of the local sand control wellbore is calculated by the following formula:

$$K_i = \frac{Q \mu \Delta L_i}{A \Delta P_i} \quad (1)$$

where, $K_i$ is the permeability of interval i on the sand-filled pipe 406, Q is the flow rate through the sand-filled pipe 406, $\mu$, is the fluid viscosity, $\Delta L_i$, is the length of interval i, A is the cross-sectional area of the sand-filled pipe 406, $\Delta p_i$ is the pressure difference between two ends of the interval i.

The permeability of the whole sand control wellbore is calculated by the following formula:

$$K_{sj} = \frac{q_j \mu}{2 \pi L_s \Delta P_j} \ln \frac{D_s}{d_s} \quad (2)$$

where, $K_{sj}$ is the permeability of the whole sand control wellbore at time j; $q_j$ is the flow rate at time j; $\Delta p_j$ is the pressure difference between inside and outside of the wellbore at time j; μ is the experimental fluid viscosity; $L_s$ is the effective length of the experimental sand screen pipe 203; $D_s$ is the inner diameter of the casing pipe 205; and $d_s$ is the inner diameter of the sand screen pipe 203.

By comparing the corresponding permeabilities before plugging, after plugging and after plugging removal and observing the simulation process, the plugging removal effect of the plugging removal tool can be evaluated. The plugging removal effect with different working parameters is analyzed and evaluated when changing a speed for lifting the oil tube 108 up and down, a pressure and displacement of the first pump 102 during the plugging removal of the whole sand control wellbore.

Under the same experimental condition, that is, the gravel filled in the gravel packing section 204 has the same size as the sand in the operating fluid, the pressure and displacement of the working pumps in plugging and plugging removal process are the same, different types of plugging removal tools or techniques are applied to obtain a best plugging removal tool or technique under certain conditions according to the plugging removal effect.

The relevant technical solutions not mentioned above can be realized by employing or learning from the prior art.

It should be noted that any equivalent substitutions or obvious modifications of the invention made by those skilled in the art under the teaching of this description should be within the scope of the present invention.

We claim:

1. A simulation device for integrated evaluation experiment for sand control wellbore plugging and plugging removal, comprising:
   a wellbore system,
   a whole sand control well plugging system,
   a local sand control well plugging system, and
   a plugging removal system;
   wherein the wellbore system comprises a casing pipe and a sand screen pipe which are fixed on a support frame; the sand screen pipe located in the casing pipe and the casing pipe are coaxially arranged; a gravel packing section is formed between the casing pipe and the sand screen pipe; and a top cover at a top of the sand screen pipe is connected to the casing pipe by bolts, so that the top cover and the sand screen pipe are sealed to form a cavity;
   the whole sand control well plugging system comprises a plurality of perforations and a second water inlet pipe; wherein the perforations are spaced apart and are distributed on the casing pipe along a length direction, and each perforation is provided with a second pressure sensor and connected to a second water tank via the second water inlet pipe which is provided with a second flowmeter, a second valve, a pressure stabilizer, a second pressure gauge and a second pump;
   the local sand control well plugging system comprises a sand-filled pipe with a plurality of third pressure sensors along an axial direction of the sand-filled pipe, and a third water inlet pipe; wherein one end of the sand-filled pipe is fixed on the casing pipe and connected to the gravel packing section, and the other end of the sand-filled pipe is connected to the second water tank via the third water inlet pipe which is provided with a third pump, a third pressure gauge, a third valve and a third flowmeter;
   the plugging removal system comprises an oil tube, a first water inlet pipe and a water outlet pipe; wherein a plugging removal tool, a centralizer, a filter and an assembly ring are successively provided from bottom to top at the oil tube which is located in and coaxially provided with the sand screen pipe; the oil tube communicates with a first water tank via the first water inlet pipe which is provided with a first pump, a first valve, a first flowmeter and a first pressure gauge; one end of the water outlet pipe communicates with the cavity, and the other end of the water outlet pipe communicates with a third water tank; and the first water inlet pipe is provided with a first pressure sensor and a confining pressure regulating valve.

2. The simulation device of claim 1, wherein a screen mesh is provided in the third water tank.

3. The simulation device of claim 1, wherein the casing pipe and the sand screen pipe are made of transparent organic glass.

4. A simulation method for integrated evaluation experiment for the sand control wellbore plugging and plugging removal using the device of claim 1, comprising:
   a) after experimental devices are connected, adding clean water as an operating fluid into the second water tank to simulate fluid production without sand, and recording flow rate and pressure according to pressure gauges, pressure sensors and flow meters;
   b) adding a certain amount of sand into the clean water as an operating fluid to simulate a plugging process of the sand control well bore; when simulating a plugging process of the whole sand control wellbore, opening the second pump to allow the operating fluid in the second water tank to flow into the wellbore system via the second water inlet pipe; when simulating a plugging process of a local sand control wellbore, opening the third pump to allow the operating fluid in the second water tank flow into the well bore system via the third water inlet pipe;
   c) opening the first pump to allow a blockage relieving acid flow into the wellbore system via the first water inlet pipe for the plugging removal; for local plugging, lifting up the plugging removal tool to the same height as the sand-filled pipe by the assembly ring; for whole plugging, lifting up and down the oil tube at a certain speed through the assembly ring while the plugging removal tool is working;
   d) recording pressure at different locations and times and flow rates at different locations; and calculating, by the following formula, permeabilities of the local sand control wellbore and the whole sand control wellbore according to the recorded pressure and flow rate:

$$K_i = \frac{Q\mu\Delta L_i}{A\Delta P_i}$$

where, $K_i$ is the permeability of interval i on the sand-filled pipe, Q is the flow rate through the sand-filled pipe, μ is the fluid viscosity, $\Delta L_i$ is the length of interval i, A is the cross-sectional area of the sand-filled pipe, $\Delta P_i$ is the pressure difference between two ends of the interval i;
   e) by comparing permeabilities before plugging, after plugging and after plugging removal and observing the simulation process, evaluating the effect of the plugging removal tool; analyzing and evaluating the plugging removal effect with different working parameters when changing a speed for lifting the oil tube up and down, a pressure and displacement of the first pump during the plugging removal of the whole sand control wellbore; under the same simulation condition, applying different plugging removal tools or techniques to obtain a best plugging removal tool or technique under certain conditions according to the plugging removal effect.

5. The simulation method of claim 4, wherein, during the simulation, the confining pressure regulating valve is adjusted to hold pressure of the wellbore system to further simulate sand control intervals of different depths, and the pressure is obtained by the first pressure sensor.

6. The simulation method of claim 4, wherein different plugging types of sand screen pipe are simulated by changing the size of the sand in the operating fluid in the second water tank and the size of gravel in the gravel packing section.

7. The simulation method of claim 4, wherein during the plugging removal process, a dye is added to the blockage relieving acid, and the process is recorded by a high-speed camera for the later evaluation of the plugging removal effect.

* * * * *